(12) United States Patent
West et al.

(10) Patent No.: US 8,946,540 B1
(45) Date of Patent: Feb. 3, 2015

(54) IMITATION SOLAR MODULE FOR USE IN A STAGGERED OR IRREGULARLY SHAPED SOLAR ARRAY

(71) Applicants: John R. West, San Rafael, CA (US); Alex Haines, San Rafael, CA (US); Kyle Tripp, San Rafael, CA (US)

(72) Inventors: John R. West, San Rafael, CA (US); Alex Haines, San Rafael, CA (US); Kyle Tripp, San Rafael, CA (US)

(73) Assignee: Zep Solar, LLC, San Rafael, CA (US)

( * ) Notice: Subject to any disclaimer, the term of this patent is extended or adjusted under 35 U.S.C. 154(b) by 0 days.

(21) Appl. No.: 14/256,657

(22) Filed: Apr. 18, 2014

(51) Int. Cl.
- *H01L 31/042* (2014.01)
- *H01L 31/048* (2014.01)
- *H01L 21/00* (2006.01)
- *H02S 99/00* (2014.01)

(52) U.S. Cl.
CPC ..................................... *H02S 99/00* (2013.01)
USPC ........... 136/244; 136/246; 136/251; 136/256; 438/73; 438/57

(58) Field of Classification Search
CPC ..................... H01L 27/1423; H01L 31/02021; H01L 31/022425; H01L 31/042; H01L 31/0422; H01L 31/048; H01L 31/0482; H01L 31/05; Y02E 10/47; Y02E 10/50; Y02E 10/52; Y02E 10/547

USPC .............. 136/244, 246, 251, 256; 438/57, 73
See application file for complete search history.

(56) References Cited

U.S. PATENT DOCUMENTS

| | | | |
|---|---|---|---|
| 6,207,889 B1 | 3/2001 | Toyomura et al. | |
| 6,534,702 B1 | 3/2003 | Makita et al. | |
| 7,328,534 B2 | 2/2008 | Dinwoodie | |
| 7,915,519 B2 | 3/2011 | Kobayashi | |
| 8,039,733 B2 * | 10/2011 | Kobayashi | ..................... 136/251 |
| 2010/0147359 A1 | 6/2010 | Harberts et al. | |

FOREIGN PATENT DOCUMENTS

JP          11-036541          2/1999

OTHER PUBLICATIONS

Sharp, "Residential System Module", 72 Watt, 2007, pp. 1-2.

* cited by examiner

*Primary Examiner* — Jayne Mershon
*Assistant Examiner* — Mayla Gonzalez Ramos
(74) *Attorney, Agent, or Firm* — Larry D. Johnson (57) ABSTRACT

An imitation solar module for structural and aesthetic use in an array of electricity generating solar modules. The imitation solar module having a non-standard shape and a visual representation such as a decal of an actual solar module surface thereon. The imitation solar module includes triangular shapes for use in staggered module arrays.

26 Claims, 13 Drawing Sheets

IMITATION SOLAR MODULE FOR USE IN A STAGGERED OR IRREGULARLY SHAPED SOLAR ARRAY

TECHNICAL FIELD

The present invention relates to solar panel arrays and solar panel mounting systems.

BACKGROUND OF THE INVENTION

Photovoltaic modules are manufactured in rectangular shapes of standard dimensions. Although different manufacturers use different dimensions for their modules, almost all standard photovoltaic modules tend to be rectangular in shape.

When these separate rectangular photovoltaic modules are installed on the roof of a building, an array of modules is formed. There are many different ways of positioning and interlocking photovoltaic modules together to form the array. For example, in some arrays, the modules are positioned such that the corner edges of four adjacent modules meet near the same general location (and are connected together using one or more connectors). In this arrangement, the overall array that is formed will have a rectangular shape (since each module will be side-by-side another module, with a module positioned above and a module positioned below).

However, in many other arrays, the photovoltaic modules are "staggered" like bricks in a wall, with the edges of two modules coming together at a location above the middle of the side edge of a third module. In these staggered arrays, the perimeter of the overall array will have a staggered edge. Unfortunately, many potential customers do not like the appearance of the jagged edge of such a staggered array. In fact, such staggered perimeter edges even discourage some people from adopting solar arrays in the first place.

Secondly, many roofing surfaces are irregular shaped and have obstructions like skylights, vents and chimneys. Such obstructions further complicate the shape of the array that can be laid down on the roof. Thirdly, the available width of the roof itself may limit the number of module rows that can be placed into the array—for example, an entire row of modules may need to be omitted if the available space for the row is slightly less than the width of the modules in the row.

What is instead desired is a system that permits a staggered or irregular shaped solar array to have a more finished and rounded or fuller edge look. It may also be desired to provide a solar array having cut-out interior sections in the modules themselves that can accommodate roofing structures such that the solar array can be positioned very close to (or even partially or fully around) objects protruding therethrough (such as vents, skylights and chimneys).

SUMMARY OF THE INVENTION

The present system provides an imitation (i.e.: non-electricity generating) solar module that is received within or at the edges of an array of standard (i.e.: electricity generating) solar modules. The present imitation solar module preferably (but not always) has a triangular or non-standard shape. To an observer, the imitation module appears to be the same type of module as all of the other standard electricity-producing modules in the array. As such, the present system offers the aesthetic benefit of the overall array being visually pleasing to the viewer. Importantly as well, however, the present imitation solar module offers many functional (non-aesthetic) benefits as well. Such benefits include module-to-module grounding, and module-to-module load distribution across the fully formed array.

In one preferred aspect, the imitation module is triangular in shape and is designed to be connected to two adjacent photovoltaic modules at the perimeter edge of a staggered solar module array such that its triangular shape "fills in" or "smooths out" the perimeter of the staggered array. A benefit of the present triangular design is that it enables the formation of an array having a smooth visually appealing perimeter. Simply put, the final array does not look like an unfinished wall of bricks. Therefore, the final array avoids large notched, angled corner edges. By using one or more triangular-shaped modules in the array, smoother and more artistic array designs are possible.

In preferred aspects, the triangular-shaped modules generate no electricity of their own, but simply operate to provide structural support to the two adjacent photovoltaic modules in the array that do generate electrical energy. However, an advantage of the present triangular shaped module is that it provides electrical grounding between adjacent photovoltaic modules. It also provides load balancing and distribution between the adjacent photovoltaic modules. Yet another advantage of the present triangular-shaped design is that the module can be fully supported on only two sides (due to its triangular shape) such that its own cantilever is minimized.

In other aspects preferred, the present imitation module is not triangular. For example, it may be a small elongated rectangle (or even square) and may be fit into position as a "spacer" between two rows of non-staggered standard solar modules.

In still other aspects, the present imitation module may be the size of a standard module, but may have a hole cut therethrough such that the module itself may be fit around an obstruction on the roof. A unique advantage of the present imitation module is that (since its top surface is only a "picture" of a solar module—and not an actual electricity generating module), the top surface may be cut into any desired shape without interfering with the electrical properties of a working solar module. Therefore, it may be provided with a side or center section cut out (so that it can be placed right up against a roof obstruction). This particular advantage is realized because the present imitation module can preferably be made from a thin panel of sheet metal. As such, the present imitation module is comparably lightweight, having a body thickness considerably less than a standard electricity generating solar module. Being thin and lightweight, it is very easy for an operator to handle and install.

Further advantages of the present imitation modules are that they are relatively inexpensive to manufacture, and quick and easy to install. Moreover, the present imitation modules require no additional installation hardware other than that already used to install the adjacent electricity generating modules. Additionally, the present imitation modules are sufficiently strong such that they meet snow and wind loading requirements. Yet another advantage of the present imitation module is that it minimizes roof penetration points (since it is supported by the adjacent fully functioning solar modules, as opposed to being fastened directly to the roof itself). It can also be attached to the array with the same standard tools that are used to fix the other fully functioning modules in place.

DETAILED DESCRIPTION OF THE DRAWINGS

The present invention provides an imitation solar module that does not generate electricity itself. It is instead positioned within an array of standard electricity generating solar modules for both structural and aesthetic purposes. This imitation solar module may have a triangular or non-standard shape. A visual representation such as a decal (or other "picture" such as a printed image) of an actual solar module surface is displayed thereon. From an aesthetic point of view, the module has a surface that appears just like a functional solar module such that an observer on the ground will believe the present module generates its own electricity just like the surrounding modules. Simply put, the imitation module will look just like one of the electricity generating modules in the array. A passer by will not notice that the module in question is merely an imitation meant to look like the adjacent fully functioning modules.

The main body portion of the present imitation module is preferably a thin panel of sheet metal. Being thin and easy to cut and work with, another aesthetic benefit is that the present module can be cut in a variety of novel shapes such that it can be used to fit at the edges of the array, or even around or beside obstructions in the center of the array. From a structural point of view, however, the imitation module has side flanges with connectors thereon to provide both grounding and load sharing with the adjacent (fully functional electricity generating) modules.

Figure 1A:
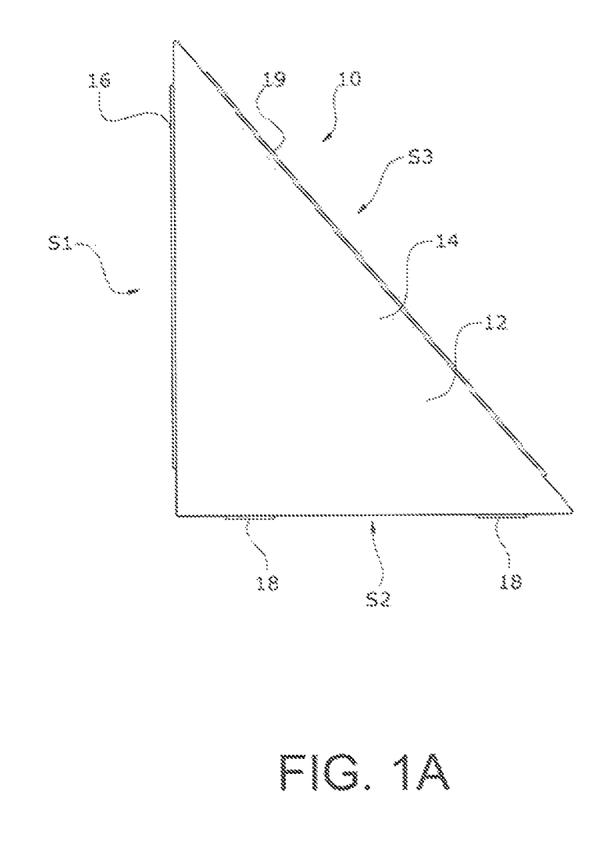
FIG. 1A is a top plan view of a triangular-shaped imitation solar module.
Figure 1B:
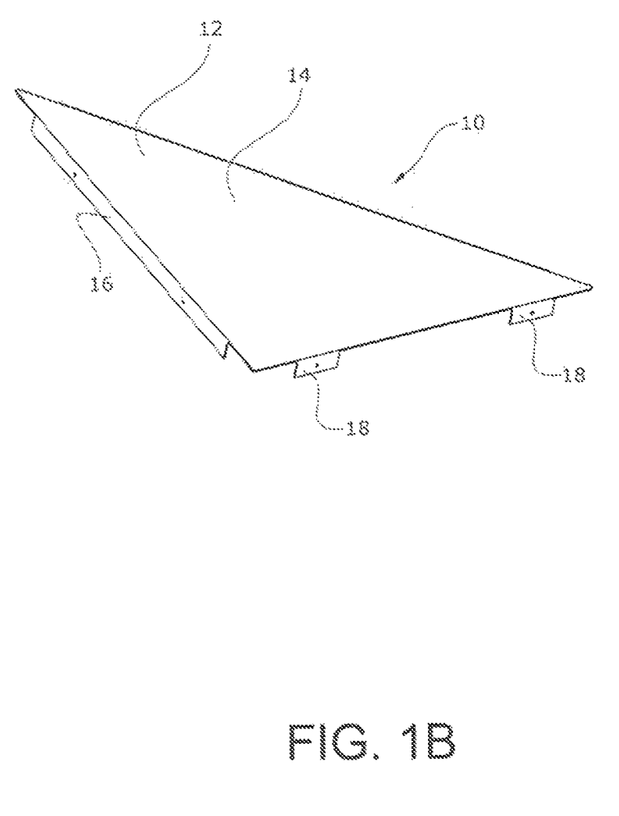
FIG. 1B is a top perspective view of the triangular-shaped imitation solar module of FIG. 1A.
Figure 2:
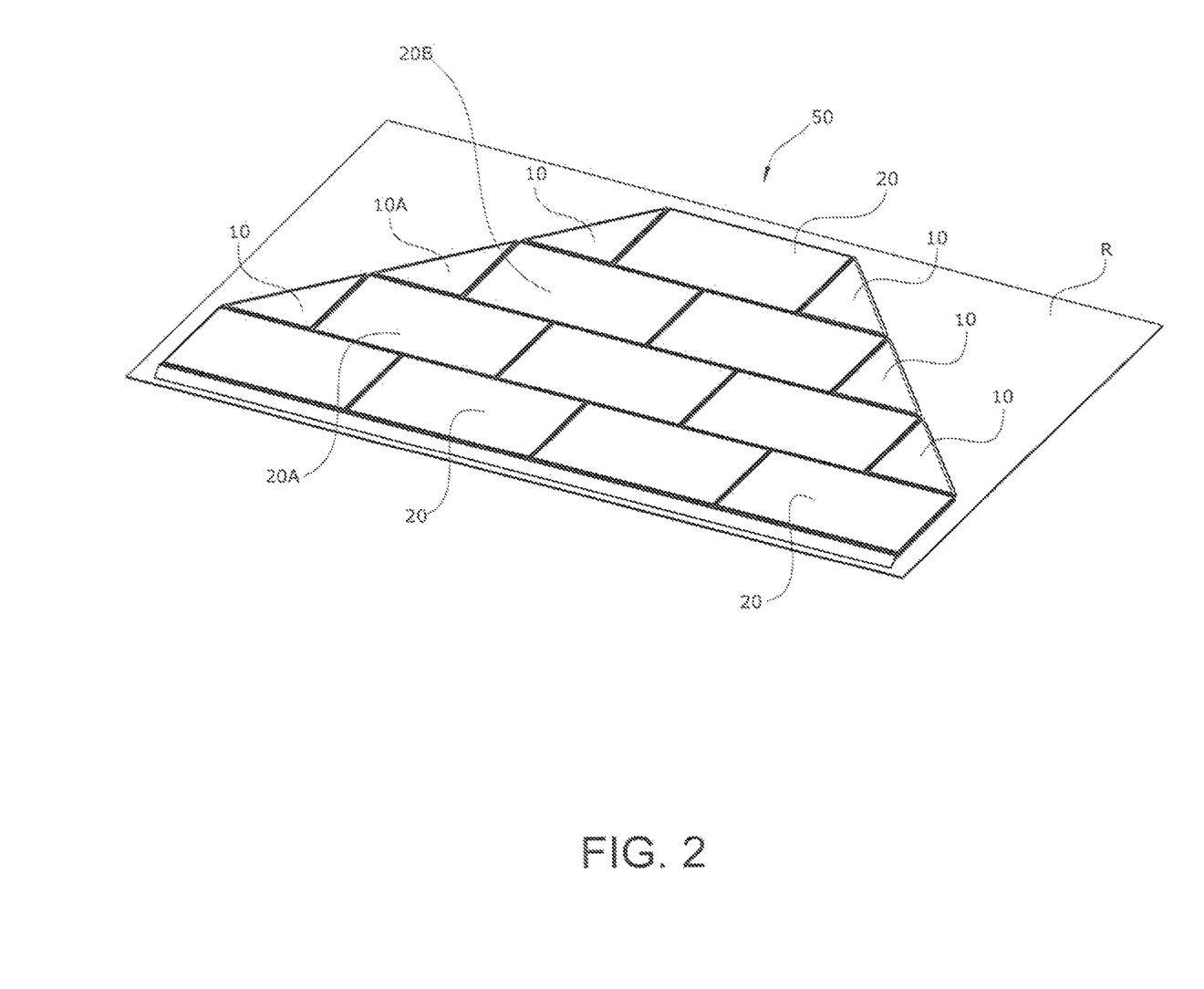
FIG. 2 is a perspective view of a solar module array using six of the triangular-shaped imitation solar modules of FIG. 1A.
Figure 3A:
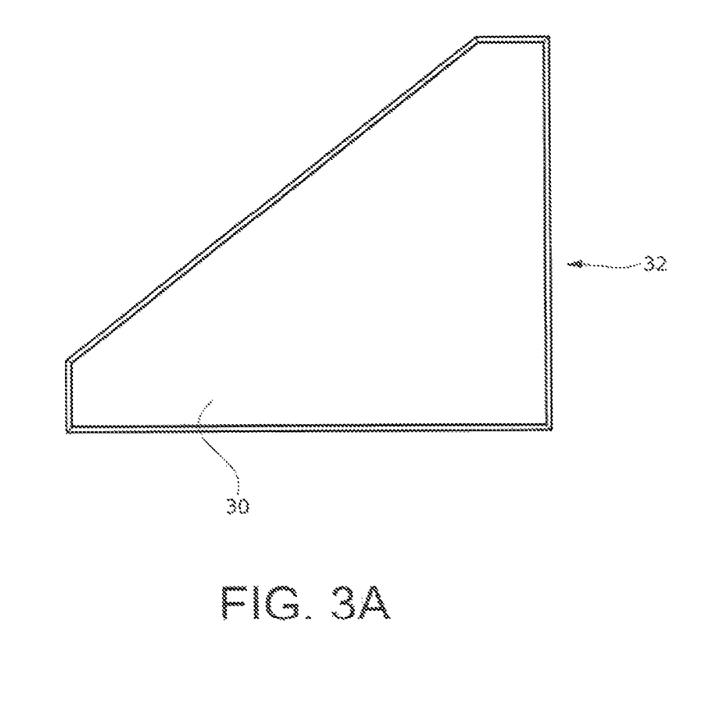
FIG. 3A is a top plan view of a truncated triangular-shaped imitation solar module having a side groove extending therearound.
Figure 3B:
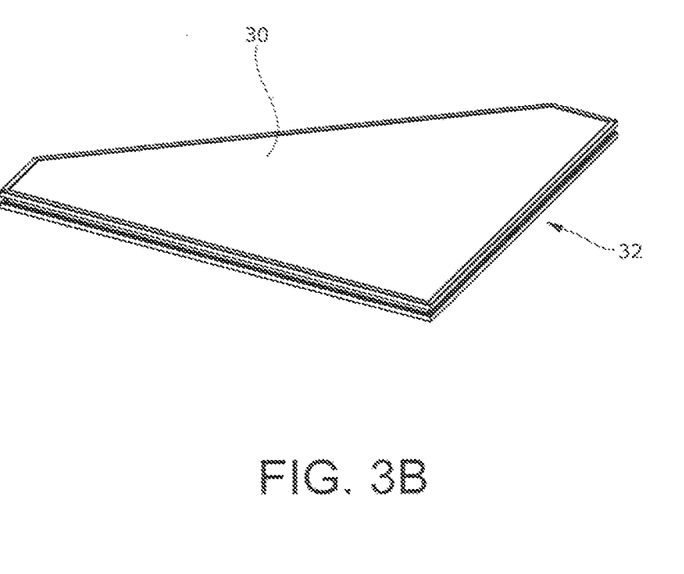
FIG. 3B is a top perspective view of the truncated triangular-shaped imitation solar module of FIG. 3A.
Figure 4:
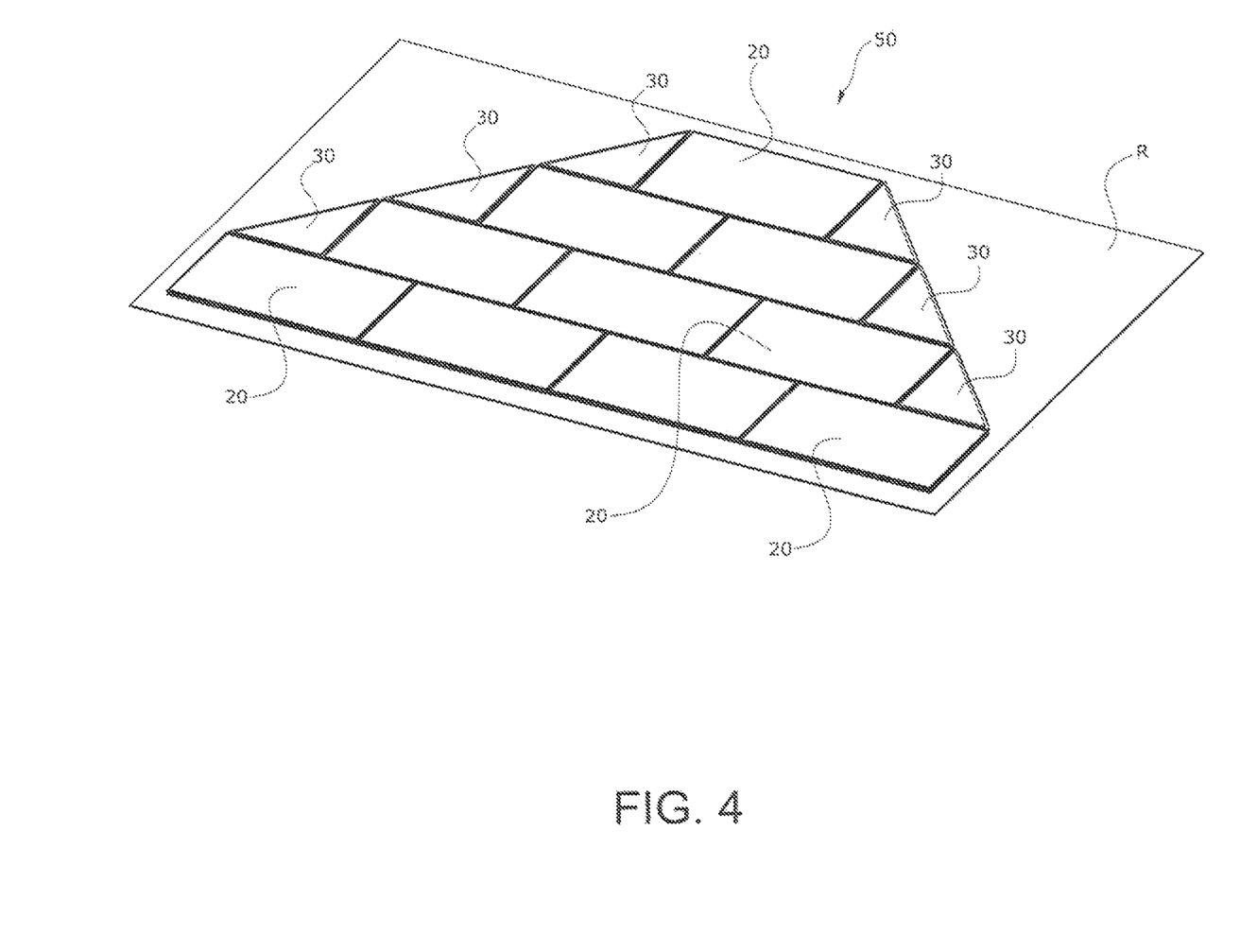
FIG. 4 is a perspective view of a solar module array using six of the triangular-shaped imitation solar modules of FIG. 3A.

FIGS. 1a to 2 show a first triangular embodiment of the invention. FIGS. 3A to 4 show a second truncated triangular embodiment of the invention. FIGS. 5 to 8B show a module-to-module coupling system for use with the present system. Lastly, FIGS. 9A through 13 show arrays with a variety of novel-shaped imitation solar modules for use in fitting around various roofing obstructions.

Referring first to FIGS. 1A to 3, triangular-shaped solar module 10 is seen. Solar module 10 generates no power of its own. Instead, as seen in FIG. 2, modules 10 are used to round out or fill the corners of an array 50 on the top of a building's roof R. In array 50, triangular-shaped modules 10 do not generate electricity. Instead, only standard photovoltaic modules 20 generate electricity.

As can be seen, triangular-shaped modules 10 offer aesthetic benefits in that they provide a much more appealing shape for the overall array 50. Specifically, the array 50 does not have the all too common appearance of a staggered module solar array which looks like bricks in an unfinished wall.

It is to be understood, however, that triangular-shaped modules 10 may add other structural, electrical and non-aesthetic benefits to the array design. For example, modules 10 provide electrical grounding between adjacent photovoltaic modules 20. Moreover, modules 10 provide load balancing and distribution between the adjacent photovoltaic modules 20.

As will be shown, triangular-shaped modules 10 advantageously need only be connected to adjacent (electricity-generating) modules 20 on two sides. Since the two sides of module 10 which are connected to modules 20 are the shorter sides (leaving only the hypotenuse unconnected to an adjacent module), modules 10 are slightly cantilevered in position. However, due to their triangular shape (and thin body structure), the cantilever effect is minimized. Thus, connections to adjacent modules 20 on only two of the three sides of module 10 are all that is required to support it in position.

In preferred aspects, the present system provides an imitation solar module for use in a photovoltaic array, comprising: a flat triangular shaped body portion 12 with a visual representation 14 of a portion of a photovoltaic module displayed on the flat triangular shaped body portion. In one aspect, visual representation 14 is simply a decal or printed or otherwise attached "picture" of a triangular section of an actual electricity-generating photovoltaic module. Basically, module 10 is simply made to look like a fully functioning photovoltaic module. When viewed from the ground, the array 50 will look like a creatively designed and shaped photovoltaic module array. An observer on the ground will not know that only modules 20 generate power while modules 10 simply look like fully functioning electricity-generating modules.

In optional preferred aspects, the decal (or printed picture) that comprises the visual representation 14 is designed such that it looks exactly like a series of standard photovoltaic cells on the surface of the adjacent electricity generating solar modules. In one exemplary embodiment, the decal comprises a substrate made of (PVC free) Envision Print Wrap™ Film or Controltac™ Graphic Film made by 3M of Saint Paul, Minn. with a covering laminate made of or Scotchcal™ Lustre Overlaminate also made by 3M. However, other suitable materials can also be used, all keeping within the scope of the present invention. Preferably, the decal or image is made or printed with a material that is both UV resistant and fade resistant. The image will have the same color as the surface of the neighboring electricity generating modules. Ideally, the module glare, reflectivity, and even the visual images of the traces (e.g.: the bus bars and metallization grid lines of the cells) will be made to match or be the same as those of the fully functioning modules. Thus, the visual image will match the cell spacing, color, and even texture of a working electricity generating module as closely as possible. Even the backsheet color is preferably chosen to match that of the electricity generating modules. When designed, the image is preferably sufficiently detailed such that it has the randomized cell colors and color gradients typically found on a solar module. (Normally, some cells are slightly darker and some are slightly lighter than one another, or some are slightly greener while others appear more purple than one another). Ideally, the visual representation 14 is designed to mimic these subtle changes. Simply put, it will look like the crystalline structure of a fully functioning solar cell module.

As stated above, triangular-shaped module 10 has a thin, planar, flat triangular shaped body portion 12. Body portion 12 is optionally given structural rigidity by a first side flange (or flanges) 16 extending downwardly from a first side 51 of the triangular shaped body portion. In addition, a second side flange (or flanges) 18 extends downwardly from a second side S2 of the triangular shaped body portion. Lastly, a third side flange (or flanges) 19 may extend downwardly from the third side S3 of the triangular shaped body portion.

As illustrated in FIG. 1, sides S1 and S2 may be the roughly same length (thereby giving the corners of body portion two roughly 45 degree angles. Note: in the actual illustration, one angle is approximately 40 degrees whereas the other is approximately 50 degrees. It is to be understood that the present triangle-shaped design encompasses any range of preferred angles (for example from 20 to 70 degrees). The longer (hypotenuse) side S3 may preferably be opposite to the 90 degree angle of the triangle.

As seen in FIG. 2, an exemplary imitation module 10A may be connected to a first adjacent photovoltaic module 20A which is adjacent in a Y-direction and to a second adjacent photovoltaic module 20B which is adjacent in an X-direction.

FIGS. 3A to 4 illustrated a second (truncated-triangle) embodiment of the imitation solar module. In this embodiment, solar module 30 has a side groove 32 extending therearound. Groove 32 is dimensioned to receive any of a variety of coupling elements therein which can be used to connect the sides of imitation module 30 to adjacent fully functioning electricity generating modules 20. FIG. 4 shows six imitation modules 30 together with standard modules 20 forming an aesthetically pleasing shaped array 50.

In preferred embodiments, modules 10 and 30 may be made of sheet metal, which gives them excellent structural strength to assist with load balancing between the adjacent modules in the array 50, yet is still thin and easy to handle.

In optional aspects of all the embodiments described herein, further features of how the decal or printed image 14 can be made can be used to enhance the illusion that the present imitation module is fully functioning. For example, decal 14 can be positioned with one of its edges spaced farther from one of the side edges of the triangle shaped body. As a result, when viewed from the ground at a certain angle, the position of decal 14 will give the illusion that a side edge of the triangle (from which the edge of the decal is spaced apart) is a raised frame on the side of the imitation module. Preferably as well, the imitation module is designed such that it appears that the visual representation 14 is at the optimal height such that it appears that it is in the same plane as the rest of the electricity generating solar cells in fully functioning modules 20. This is a unique advantage of the invention in that its main body portion may be made from a thin, planar section of sheet metal, yet still give the illusion that it has the same thickness as the surrounding electricity generating modules. Stated another way, the visual representation 14 can be positioned in the same plane as the cells in the surrounding functioning modules, with the side frames 16 and 18 reaching downward from body 12 to provide a platform for couplings which link it to adjacent modules.

Figure 5:
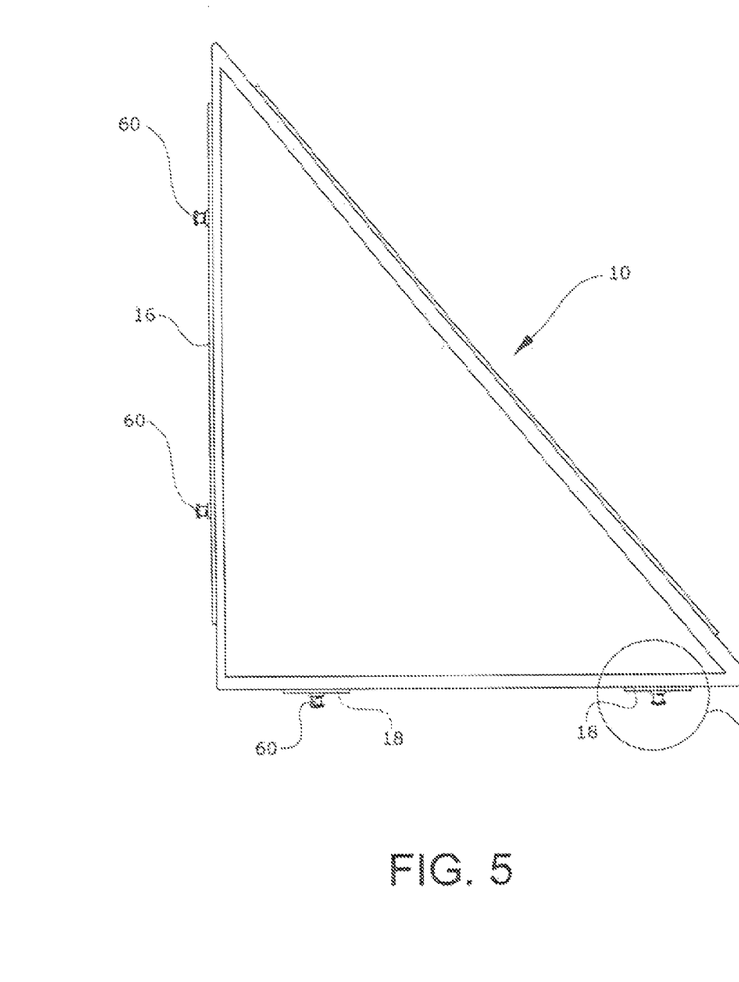
FIG. 5 is a top plan view of a triangular-shaped imitation solar module with couplings attached thereto.
Figure 6:
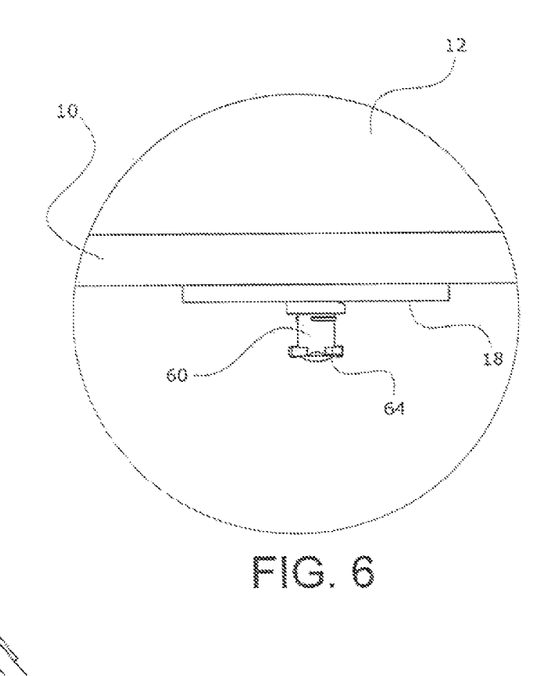
FIG. 6 is a close-up view of one of the couplings of the triangular-shaped solar module of FIG. 5.
Figure 7A:
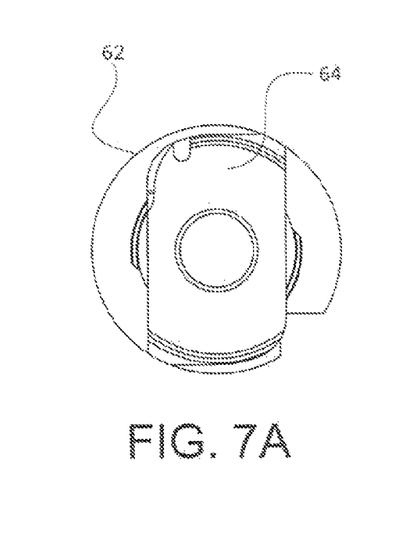
FIG. 7A is a front elevation view of an exemplary coupling of FIG. 6.
Figure 7B:
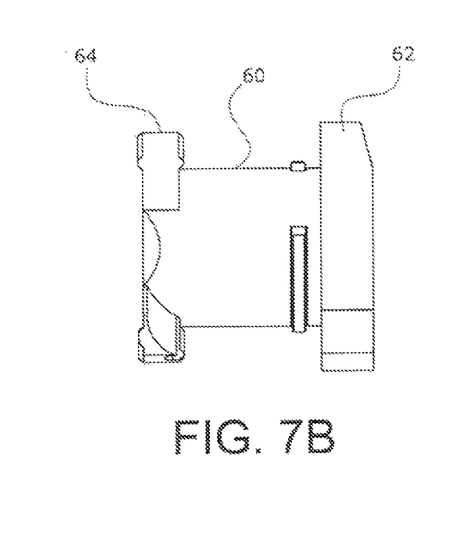
FIG. 7B is a side elevation view of the exemplary coupling of FIG. 6.
Figure 7C:
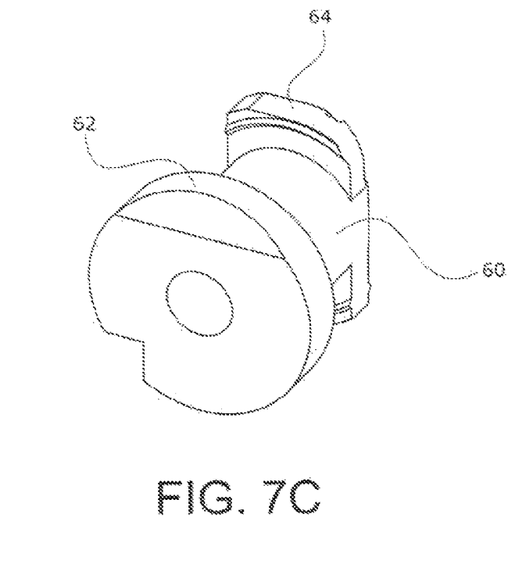
FIG. 7C is a rear perspective view of the exemplary coupling of FIG. 6.

Next, FIGS. 5 to 8B illustrate exemplary systems for connecting module 10 to adjacent modules 20. As seen in FIGS. 5 and 6, a pair of couplings 60 may be placed on two of the sides of the triangle. Coupling 60 may have a generally round base 62 and a T-shaped head 64. Coupling 60 may be received through a hole in side flanges 16 or 18. It may optionally be riveted in place, (such that it rotates but does not overtighten), but it is to be understood that the present invention encompasses all suitable fastening mechanisms. Note as well that flanges 16 and 18 may either extend partially or fully along the respective sides of module 10. It is to be understood that the present invention encompasses embodiments with one or more flanges on any of its sides.

Figure 8A:
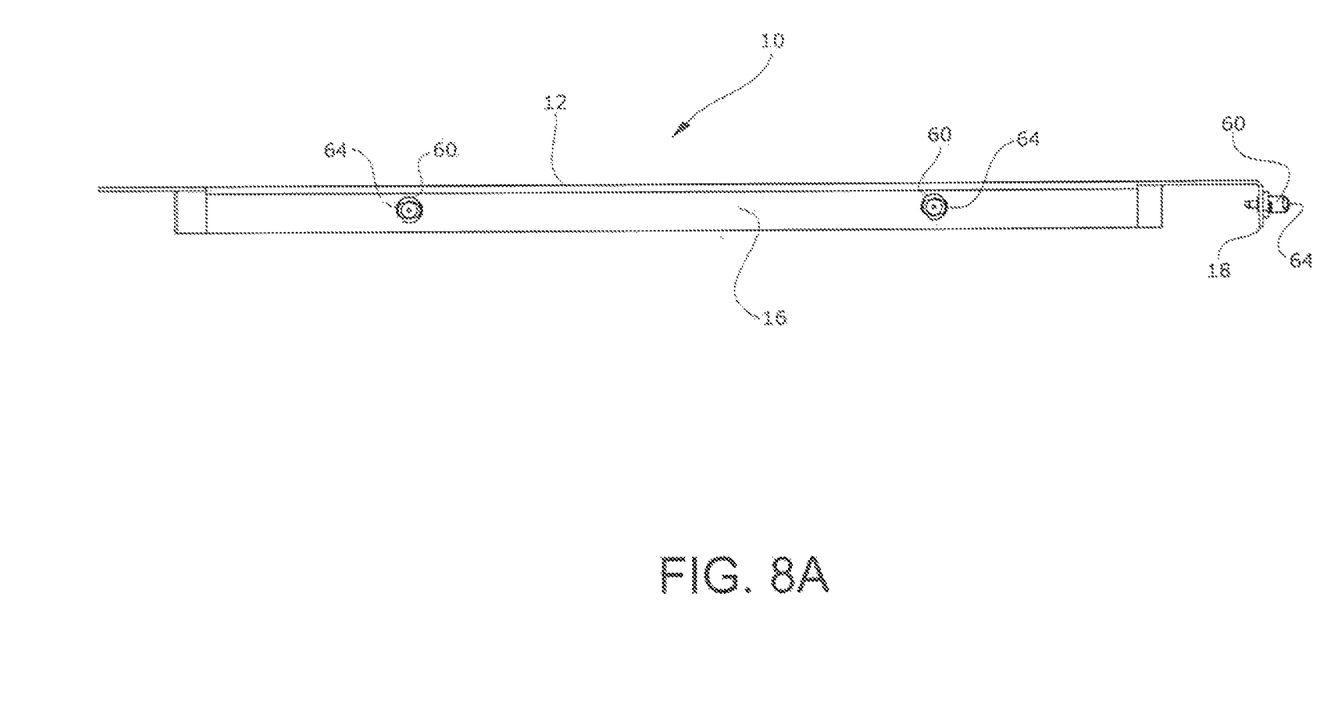
FIG. 8A is a side elevation view corresponding to FIG. 5, with the couplings rotated to an unlocked position.
Figure 8B:
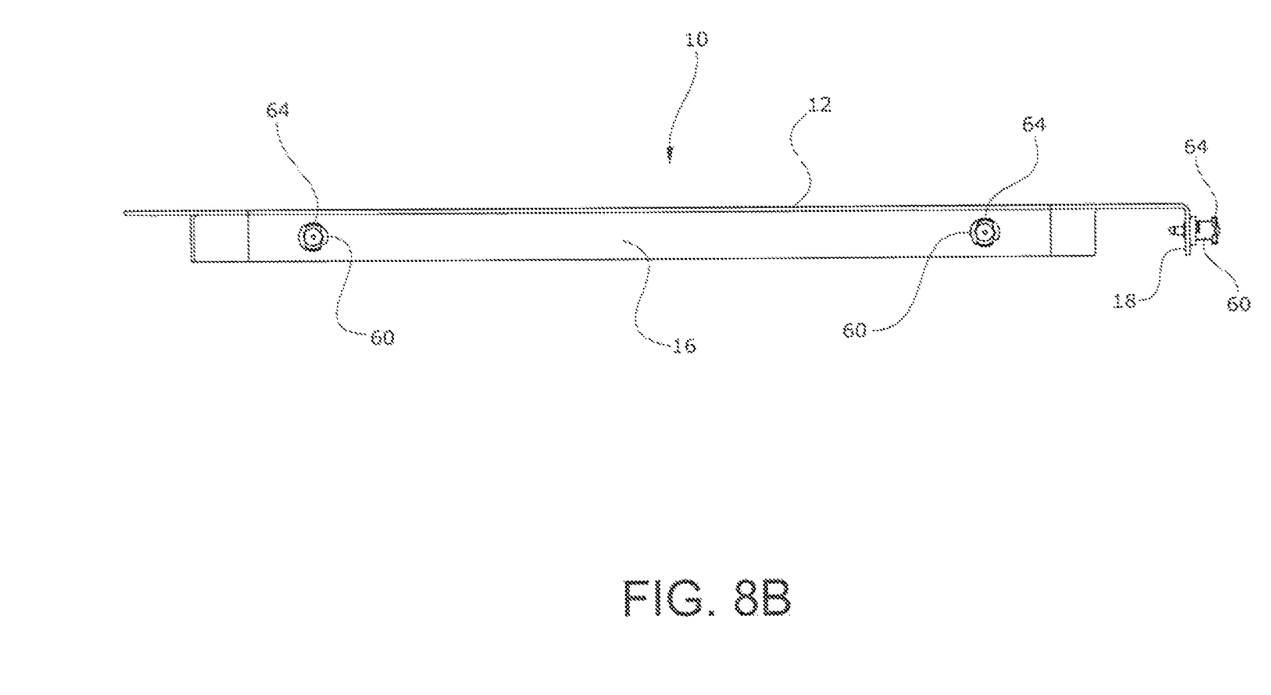
FIG. 8B is a side elevation view corresponding to FIG. 5, with the couplings rotated to a locked position.

In operation, couplings 60 are simply rotated by approximately 90 degrees to lock T-shaped head 64 into a side groove of the first and second adjacent photovoltaic modules. Specifically, FIG. 8A shows couplings 60 with their T-shaped heads 64 rotated to an unlocked position (such that it can be inserted into a side groove in an adjacent module 20) whereas FIG. 8B shows couplings 60 with their T-shaped heads 64 rotated to a locked position (such that it can be securely held within a side groove in an adjacent module 20).

It is to be understood, that the present invention also encompasses imitation solar modules that do not have a triangular shape. Examples of such non-triangular modules are seen in FIGS. 9A to 13, as follows.

Figure 9A:
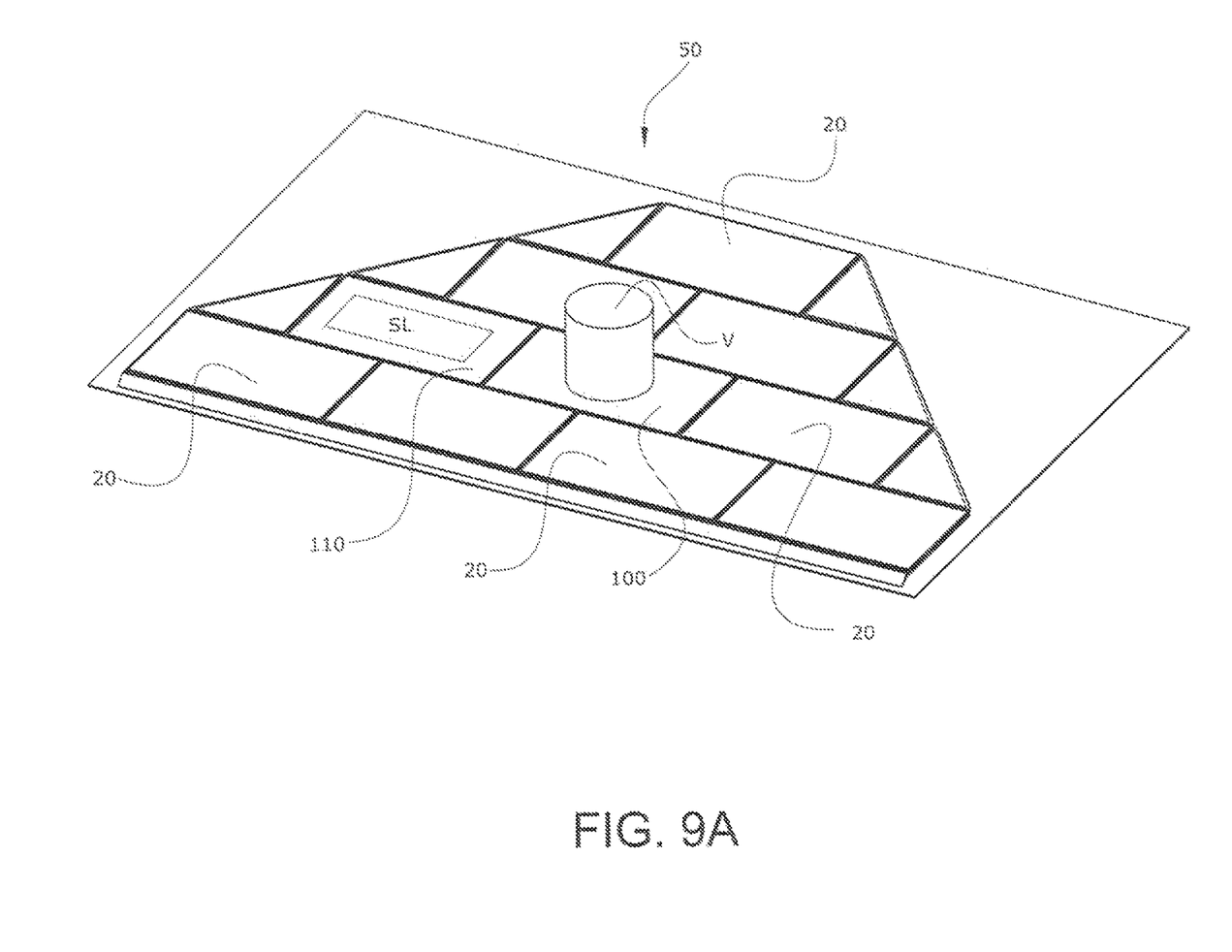
FIG. 9A is a perspective view of a solar module array with additional non-standard shaped imitation solar modules dimensioned with cut out sections.
Figure 9B:
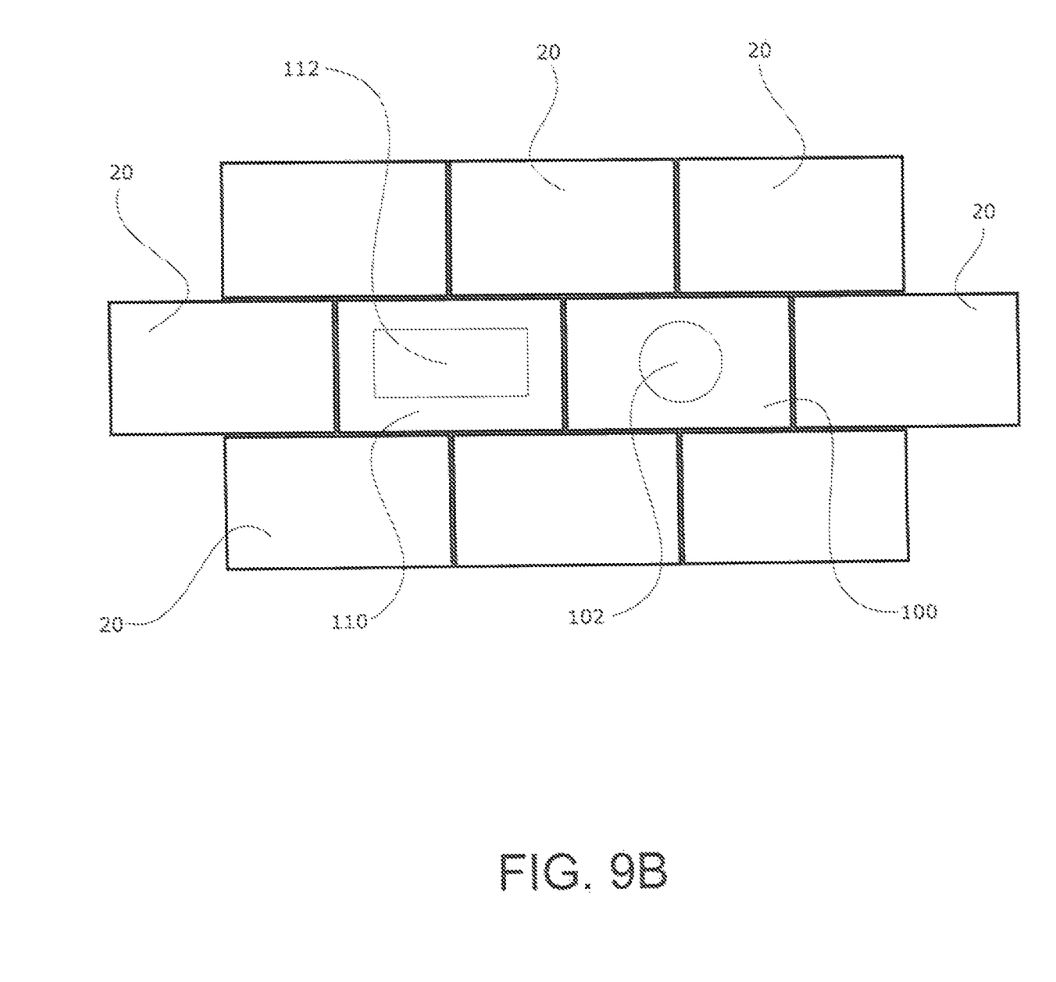
FIG. 9B is a top plan view corresponding to FIG. 9A.

In FIGS. 9A and 9B, a first imitation module 100 has a circular center hole 102 cut therein such that it can be received around a roof vent V. A second imitation module 110 has a rectangular center hole 112 cut therein so as not to obstruct the view through a skylight SL therethrough. As can be appreciated, one advantage of imitation modules 100 and 110 is how close they can be built to the sides of the roof obstruction. This provides a structurally solid array on the roof, without having to leave any large gaps which a standard rectangular-shaped module does not fit in the remaining spaces. Again, cutting such sections out of the body portion of the imitation module is facilitated by the use of a thin sheet metal panel as the main body portion 12.

Figure 10:
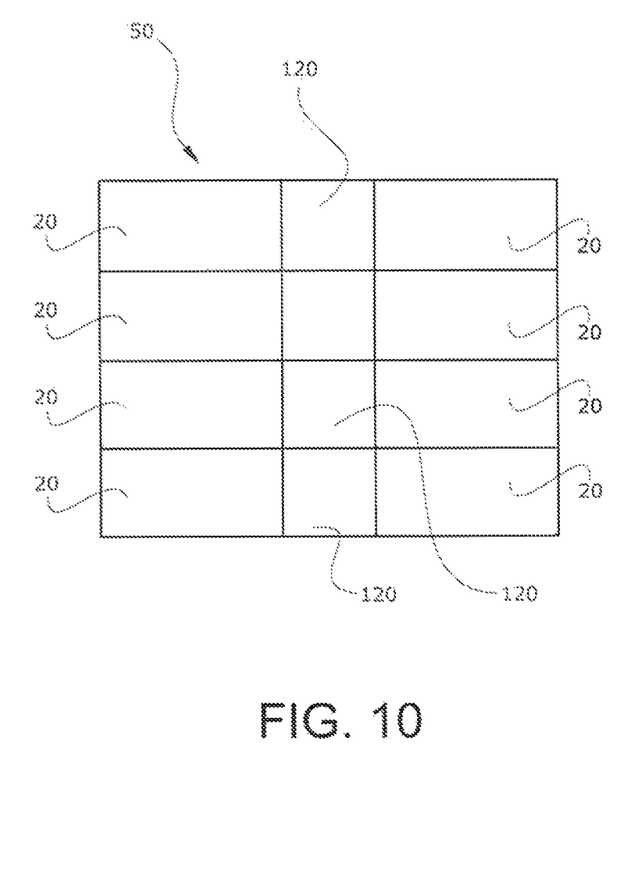
FIG. 10 is a top plan view of a solar array with imitation solar modules acting as "spacers" between rows of functional electricity generating solar modules.

FIG. 10 shows a different situation where two rows of modules 20 are positioned an irregular distance apart. In this situation, a row of imitation modules 120 can be positioned therebetween to act as "spacers". This situation may occur when one row of modules 20 has to be positioned adjacent to a roof edge, or other obstruction. Modules 120 permit a single array 50 to be formed (as opposed to two separated rows formed of modules 20).

Figure 11:
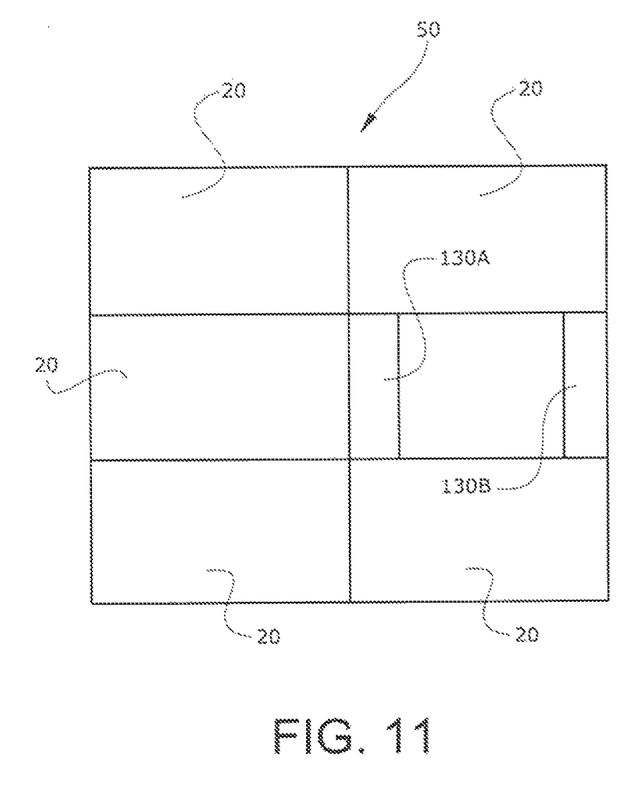
FIG. 11 is a top plan view of a solar array with two narrow imitation solar modules positioned between two adjacent functional solar modules.

FIG. 11 shows the situation of two small narrow rectangular imitation modules 130A and 130B partially filling a gap between adjacent electricity generating modules 20. The space between modules 130A and 130B is left open to accommodate an obstruction in the roof (not shown).

Figure 12:
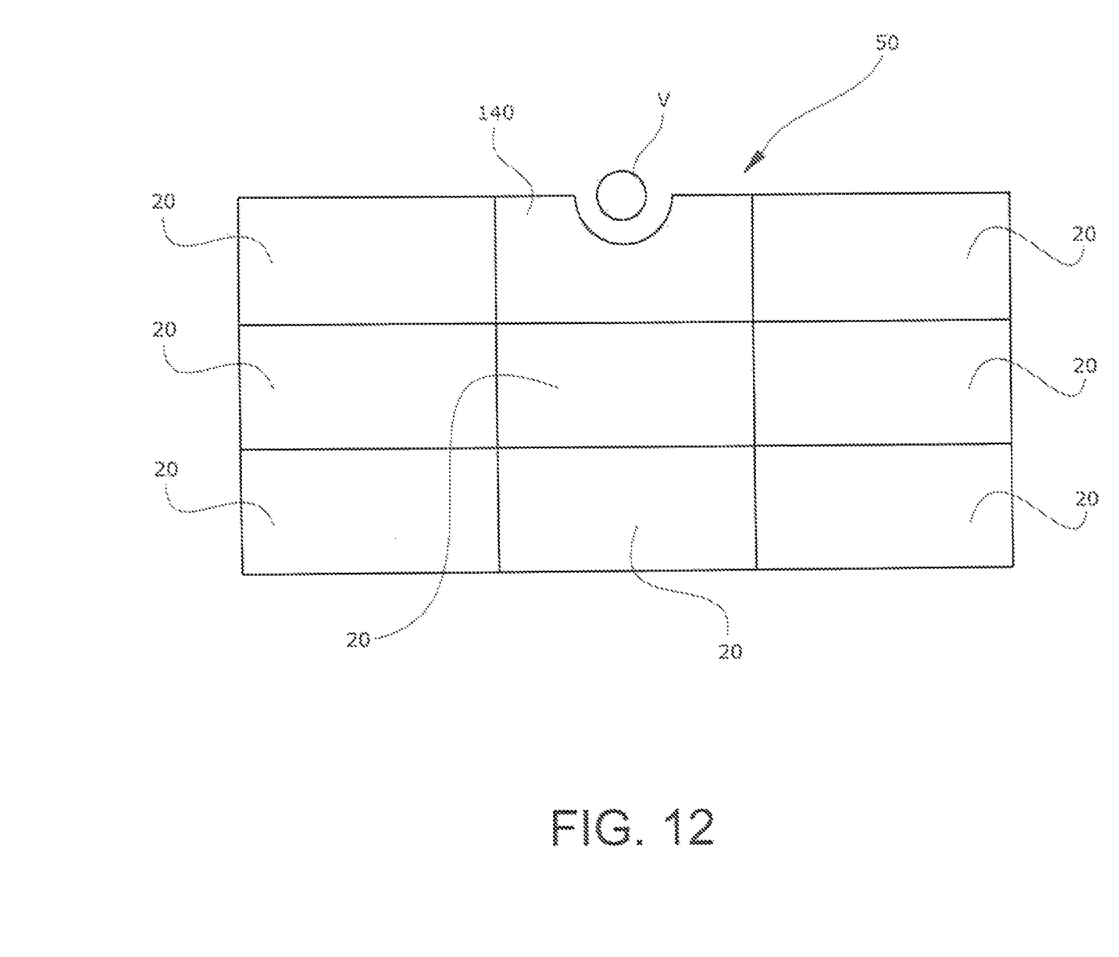
FIG. 12 is a top plan view of a solar array with an imitation solar module having a cut out side portion, to make way for an obstruction on a roof.

FIG. 12 shows an imitation solar module 140 having a cut out side section that enables the array to be positioned up close against a roof vent V.

Figure 13:
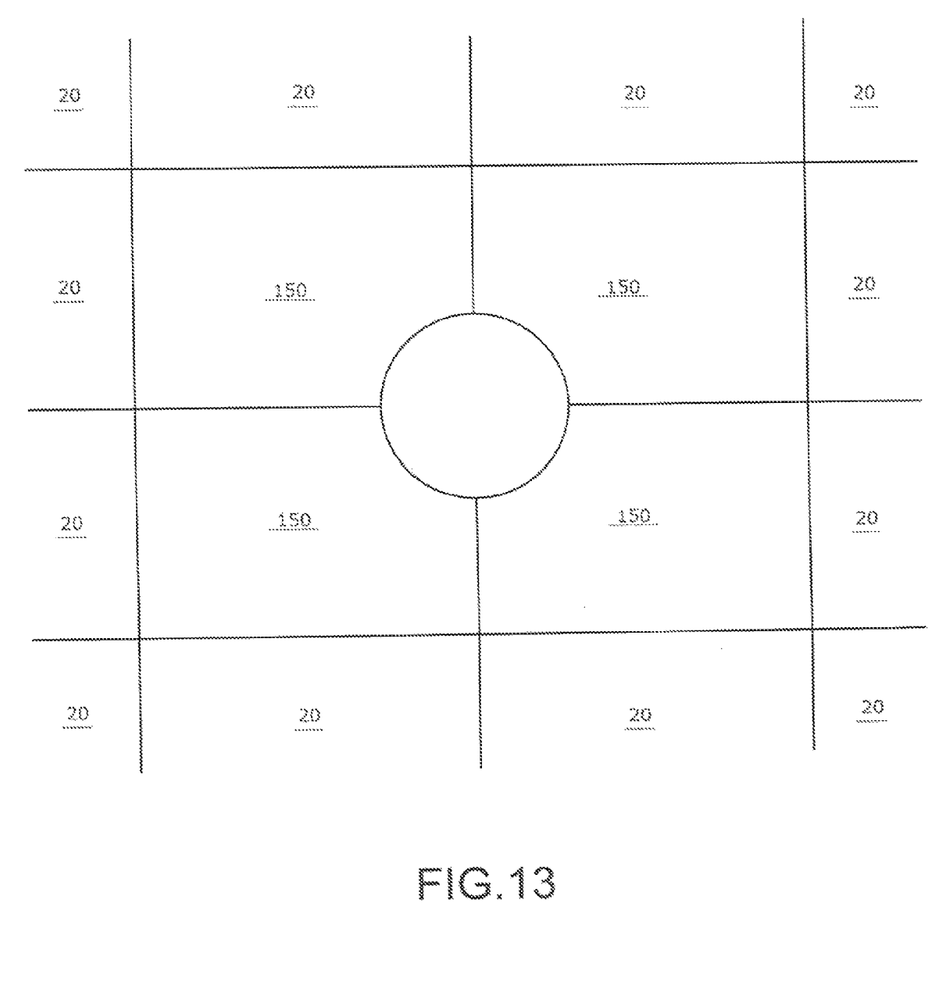
FIG. 13 is a top plan view of a solar array with four imitation solar modules having cut-out corners to fir around an obstruction on a roof.

Lastly, FIG. 13 shows four imitation modules 150 (surrounded by fully functioning electricity generating modules 20), where each of imitation modules 150 have a rounded corner section cut out such that they can be arranged as shown to provide space for a roof obstruction (such as a vent or chimney).

As can be appreciated, the present imitation solar module can be provided in many shapes and sizes. Without limitation, it may be triangular, rectangular or some other regular or irregular shape. It may have straight edges, curved edges or cut-out edges, or any combination of the above.

In preferred aspects, the body portion of the imitation module is made of aluminum or galvanized sheet metal. However, in further optional embodiments, the body portion of the imitation module may instead be made of steel, glass, plastic, fiberglass, plastic, or other suitable material. In fact, the body portion of the imitation module may be made from an actual photovoltaic module that is simply cut to shape. Such a cut or sliced through module will no longer generate any electricity, but it may be cut into a shape such that it can fit into a triangular or other irregularly shaped imitation module. There are two benefits to cutting up and using existing (but no longer electricity generating) modules in this way. First, their color and visual appearance will be the same as a functioning module, and will not change over time. Second, using old previously functioning modules in new imitation modules provides a system for recycling existing modules that had stopped functioning. Therefore, such old, non-functioning modules can be cut into new shapes (such as triangles) put to use as imitation modules.

What is claimed is:

1. An imitation solar module for use in a photovoltaic array, comprising:
    a flat triangular shaped body portion;
    a visual representation of a portion of a photovoltaic module displayed on the flat triangular shaped body portion;
    a first side flange extending downwardly from a first side of the triangular shaped body portion;
    at least one coupling on the first side flange for connecting the triangular shaped body portion to a first adjacent photovoltaic module;
    a second side flange extending downwardly from a second side of the triangular shaped body portion; and
    at least one coupling on the second side flange for connecting the triangular shaped body portion to a second adjacent photovoltaic module.

2. The imitation solar module of claim 1, wherein the first adjacent photovoltaic module is adjacent in an X-direction and the second adjacent photovoltaic module is adjacent in a Y-direction.

3. The imitation solar module of claim 1, wherein the visual representation of a portion of a photovoltaic module is a decal affixed to the top of the flat triangular shaped body portion.

4. The imitation solar module of claim 1, wherein the imitation solar module comprises no electricity generating elements.

5. The imitation solar module of claim 1, wherein the at least one coupling on the first side flange comprises a pair of couplings, and the at least one coupling on the second side flange comprises a pair of couplings.

6. The imitation solar module of claim 1, wherein the couplings are dimensioned to be rotated by approximately 90 degrees to lock into a side groove of the first and second adjacent photovoltaic modules.

7. The imitation solar module of claim 1, wherein the flat body portion is made of sheet metal.

8. The imitation solar module of claim 1, wherein the flat body portion comprises a surface indentation and the visual representation of a portion of a photovoltaic module is displayed within the surface indentation on the flat triangular shaped body portion.

9. The imitation solar module of claim 1, wherein the position of the visual representation on the flat triangular shaped body portion gives the illusion that a side edge of the triangular shaped body portion is a raised frame on the side of the imitation module.

10. The imitation solar module of claim 1, wherein the appearance of the visual representation on the flat triangular shaped body portion mimics the color, color gradients and cell surface features seen in an electricity generating solar module.

11. An imitation solar module for use in a photovoltaic array, comprising:
    a flat, generally planar body portion;
    a visual representation of a photovoltaic module displayed on the flat generally planar body portion;
    a first side extending downwardly from the flat generally planar body portion, wherein the first side is adapted to be connected to a first adjacent photovoltaic module; and
    a second side extending downwardly from the flat generally planar body portion, wherein the second side is adapted to be connected to a second adjacent photovoltaic module.

12. The imitation solar module of claim 11, wherein the first and second sides are adapted to be connected to the first and second adjacent photovoltaic modules by at least one coupling on each of the first and second sides that extend downwardly from the flat body portion.

13. The imitation solar module of claim 11, wherein the first and second sides are adapted to be connected to the first and second adjacent photovoltaic modules by a side groove on each of the first and second sides of the module, the side grooves being dimensioned to receive a coupling therein.

14. The imitation solar module of claim 11, wherein the visual representation of a portion of a photovoltaic module is a decal affixed to the top of the body portion.

15. The imitation solar module of claim 11, wherein the appearance of the visual representation on the flat generally planar body portion mimics the color, color gradients and cell surface features seen in an electricity generating solar module.

16. The imitation solar module of claim 11, wherein the solar module comprises no electricity generating elements.

17. The imitation solar module of claim 12, wherein the at least one coupling comprises a pair of couplings on each of the first and second sides.

18. The imitation solar module of claim 11, wherein the flat body portion is rectangular.

19. The imitation solar module of claim 11, wherein the flat body portion has a curved edge.

20. The imitation solar module of claim 11, wherein the flat body portion has a cut-out section.

21. The imitation solar module of claim 11, wherein the flat body portion has an irregular shape.

22. The imitation solar module of claim 11, wherein the flat body portion is made of sheet metal.

23. The imitation solar module of claim 11, wherein the flat body portion comprises a surface indentation and the visual representation of a portion of a photovoltaic module is displayed within the surface indentation on the flat body portion.

24. An array of electricity generating and imitation solar modules, comprising:
    (a) a plurality of electricity generating solar modules;

(b) a plurality of imitation solar modules that do not generate electricity, each imitation solar module comprising:
- a flat, generally planar body portion;
- a visual representation of a photovoltaic module displayed on the flat generally planar body portion;
- a first side extending downwardly from the flat generally planar body portion, wherein the first side is adapted to be connected to a first adjacent photovoltaic module; and
- a second side extending downwardly from the flat generally planar body portion, wherein the second side is adapted to be connected to a second adjacent photovoltaic module; and (c) a plurality of couplings connecting the imitation solar modules to the electricity generating solar modules to form an array of electricity generating and imitation solar modules.

25. The array of claim 24, wherein the plurality of imitation solar modules are triangular in shape.

26. The array of claim 24, wherein the flat, generally planar body portions of the plurality of imitation solar modules are made of sheet metal.

\* \* \* \* \*